United States Patent [19]
Matsuoka

[11] Patent Number: 5,244,396
[45] Date of Patent: Sep. 14, 1993

[54] CONNECTOR FOR ELECTRIC PART

[75] Inventor: Noriyuki Matsuoka, Yokohama, Japan

[73] Assignee: Yamaichi Electronics Co., Ltd., Tokyo, Japan

[21] Appl. No.: 985,211

[22] Filed: Dec. 3, 1992

[30] Foreign Application Priority Data

Dec. 20, 1991 [JP] Japan .................. 3-355993

[51] Int. Cl.⁵ .............................. H01R 9/09
[52] U.S. Cl. ........................ 439/72; 439/70; 439/73; 439/331; 439/525
[58] Field of Search ............... 439/66, 70–73, 439/78, 81–83, 330, 331, 525

[56] References Cited

U.S. PATENT DOCUMENTS

| | | | |
|---|---|---|---|
| 4,634,199 | 1/1987 | Anhalt et al. | 439/66 |
| 4,793,814 | 12/1988 | Zifcak et al. | 439/66 |
| 4,836,791 | 6/1989 | Grabbe et al. | 439/81 |
| 5,035,629 | 7/1991 | Matsuoka | 439/70 |
| 5,069,629 | 12/1991 | Johnson | 439/71 |
| 5,152,694 | 10/1992 | Bargain | 439/70 |
| 5,192,213 | 3/1993 | Kosugi et al. | 439/81 |

FOREIGN PATENT DOCUMENTS 3-73447 7/1991 Japan .

Primary Examiner—Paula A. Bradley
Attorney, Agent, or Firm—Wenderoth Lind & Ponack

[57] ABSTRACT

Each contactor 5 is implanted in an insulating substrate 1 at an inclination angle, and its contacting portion 6 is diagonally moved along the inclined axis of movement to accumulate a contacting pressure with respect to an electric part terminal 4.

3 Claims, 3 Drawing Sheets

CONNECTOR FOR ELECTRIC PART

BACKGROUND OF THE INVENTION

1. Field of the Invention

This invention relates to a connector for an electric part having a plurality of terminals of an electric part such as an IC package, etc.

2. Brief Description of the Prior Art

In a connector in which when a contacting portion of a connector is moved in one direction while moving linearly, it accumulates a resilient force directing to the other direction, and a contacting pressure with respect to a terminal of an electric part placed on the contacting portion is obtained by this resilient force, the contactor is installed such that the axis of movement of the contacting portion is perpendicular to a horizontal installation plane of the connector, in other words, a horizontal mounting plane of the electric part, and the contacting portion is vertically pushed down by the electric part terminal to generate a vertical pushing up force as a reaction thereof, so that a contacting pressure with respect to the electric part terminal can be obtained.

However, since the contacting portion is moved downward in the same direction (vertical direction) to the pushing down direction of the electric part terminal, a wiping effect at the contacting portion cannot be expected although a contacting pressure can be obtained. Therefore, there is such a problem that a wholesome contacting relation is interrupted by the oxide film formed on the contacting portion. To solve this problem, there is proposed a construction in which, as shown in Japanese Utility Model Early Laid-Open Publication No. Sho 3-73447, the contacting portion is vertically moved while pivoting. However, since the structure of the contactor for pivoting the contacting portion becomes complicated, the cost is increased.

SUMMARY OF THE INVENTION

It is therefore an object of the present invention to provide a connector for an electric part in which a contacting portion of a contactor, on which an electric part terminal is placed, is diagonally linearly moved downward in such a manner as to slide along a lower surface of the terminal so as to provide a favorable wiping action and at the same time a wholesome contacting relation can be obtained, and in addition the contactor is mounted in an inclined posture so that a thin insulating substrate can be obtained.

To achieve the above object, there is essentially provided a connector for an electric part comprising an insulating substrate and contactors each including a movable contacting portion on which a terminal of an electric part is placed, and implanted in the insulating substrate, the movable contacting portion being moved downward along an axis of movement thereof to accumulate an ascending resilient force for obtaining a contacting pressure with respect to the electric part terminal, wherein the contactor is implanted in the insulating substrate at an inclination angle with respect to a mounting plane of the insulating substrate, the movable contacting portion being diagonally moved downward along the inclined axis of movement in order to obtain the contacting pressure.

According to the present invention, the electric part and its terminals are vertically pushed down with respect to the mounting plane of the insulating substrate, while the contacting portions are diagonally moved downward along the inclined axis of movement while press contacting with the lower surfaces of the electric part terminals, respectively. Therefore, at the time when the contacting portions are diagonally moved downward, the press contacting points thereof are slid on the contacting surfaces of the electric part terminals in accordance with the progress of the downward movement, thereby providing a so-called proper wiping effect. As a result, a wholesome contacting relation between each contactor and each electric part terminal can be obtained. In addition, since the contactors are implanted in their inclined postures, the insulating substrate can be formed thin.

DETAILED DESCRIPTION OF THE EMBODIMENT

The present invention will now be described in the form of one preferred embodiment with reference to the accompanying drawings.

Figure 1:
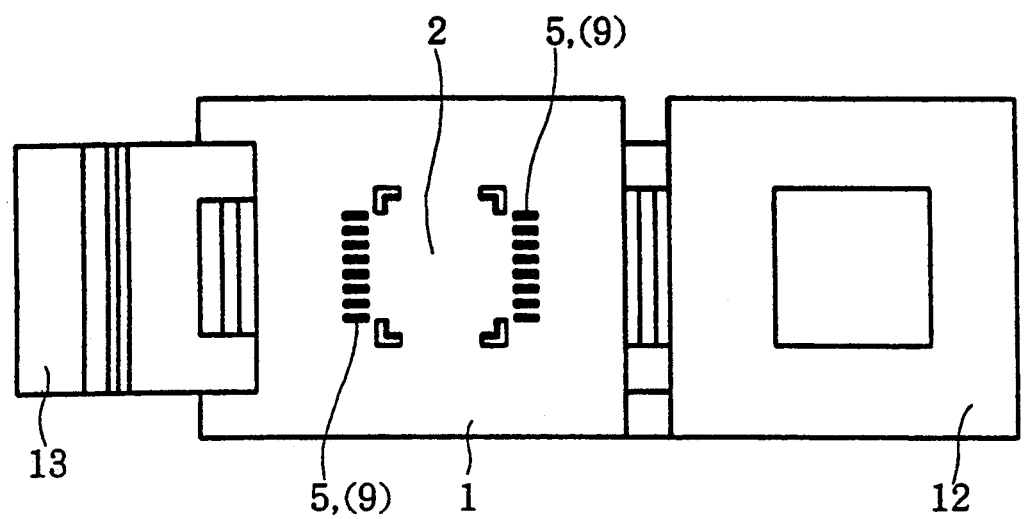
FIG. 1 is a plan view of a connector for an electric part embodying the present invention.
Figure 2:
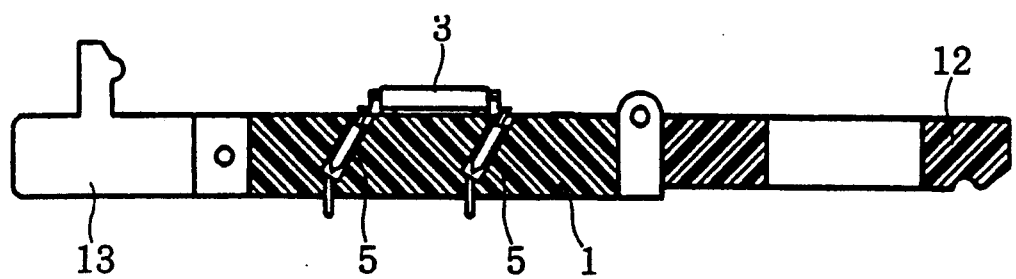
FIG. 2 is a sectional view of the above.
Figure 3:
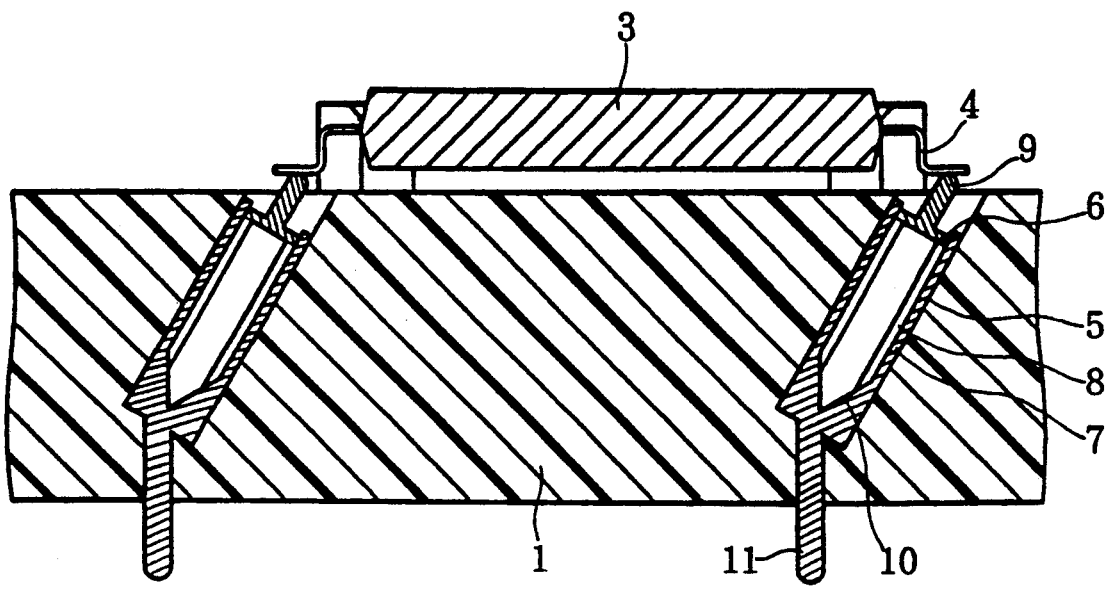
FIG. 3 is an enlarged sectional view showing an important portion of the above, in which an electric part terminal is already placed on a contactor but not yet press contacted with it.
Figure 4:
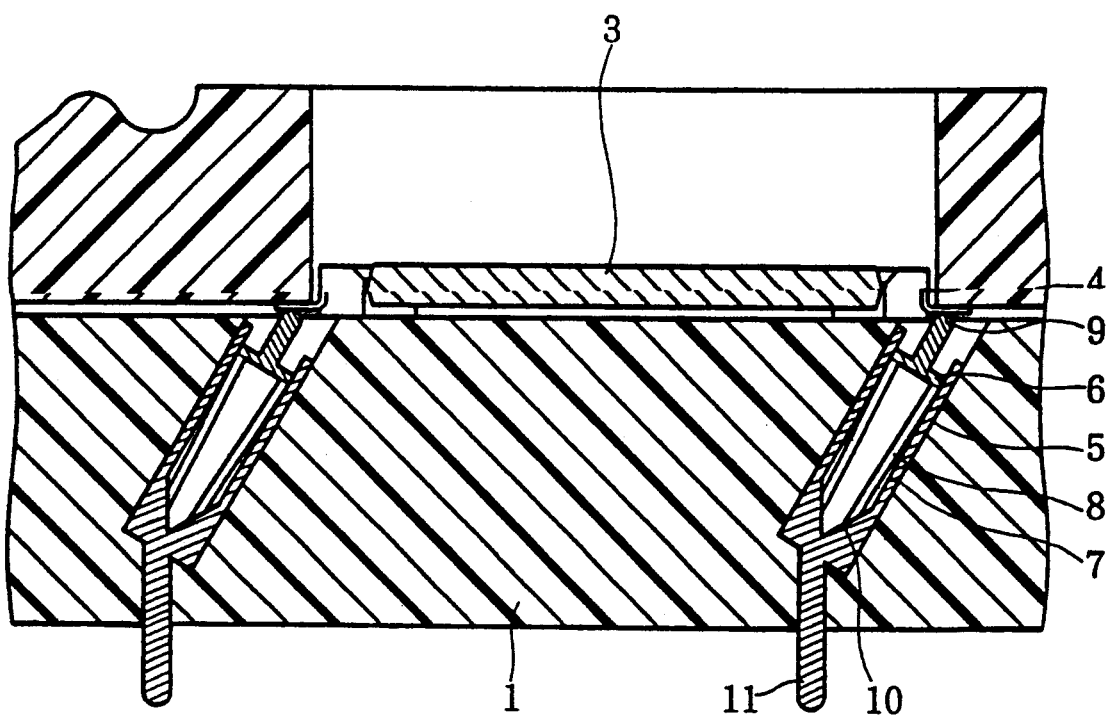
FIG. 4 is likewise an enlarged sectional view of the important portion, but in which the electric part terminal is not only placed on the contactor but also press contacted with it.

In FIGS. 1 through 5 inclusive, the numeral 1 denotes an insulating substrate forming a connector main body. The insulating substrate 1 has a mounting section 2 formed at a central portion of its upper surface and adapted to receive an electric part. The insulating substrate 1 is provided with a plurality of contactors 5 arranged thereon such that terminals 4 of the electric part 3 are contacted with the contactors 5 when the electric part 3 is placed on the mounting section 2. Each contactor 5 has a movable contacting portion 6, so that a corresponding terminal 4 of the electric part 3 is placed thereon to contact. The contactor 5 is designed such that the movable contacting portion 6 can move linearly. FIG. 3 depicts one example of the contactor. As depicted, this contactor 5 comprises the contacting portion 6 and a cylindrical portion 7 having a bottom. The contacting portion 6 is axially movable within the cylindrical portion 7 and has a spring element 8 extending in parallel with its axially moving direction. The contacting portion 6 also has a contacting nose 9 formed on an area of connection at an upper end of the spring element 8 and axially projecting outward from an upper end opening portion of the cylindrical portion 7. The cylindrical portion 7 is provided at its inner bottom portion opposite a lower end of the spring element 8 with an inclination cam surface 10 having an inverted cone shape converging downwardly. As depicted in FIG. 4, when the contacting portion 6 moves downward, the spring element 8 is brought into abutment with the inclination cam surface 10 and contracted against elasticity thereof and the contacting portion is applied a ascending force along the axis of movement by a reaction thereof. The nose 9 is press contacted with the electric part terminal 4 by this ascending force.

The contactor 5 is of a construction where the contacting portion 6 is linearly movable. For example, the contacting portion 6 is resiliently held by a coil spring, etc. in order to allow the portion 6 to linearly move.

As shown in FIGS. 2 through 4, the contactors 5 are implanted in the insulating substrate 1 at an inclination angle in order to incline the axis of movement of the contacting portion 6, so that the nose 9 projects from the upper surface of the insulating substrate 1 on the inclination axis of movement.

Specifically, each contactor 5 is implanted in the insulating substrate 1 at such an angle that its axis is inclined with respect to an installation plane (electric part mounting plane of the insulating substrate 1) of the insulating substrate 1. In other words, the contactor 5 is implanted in the insulating substance 1 at such an angle that the contactor 5 is inclined with respect to a pushing down axis (perpendicular) of the electric part 3 and terminal 4. The contactor 5 has a male terminal 11 vertically projecting from a lower end of the cylindrical portion 7. For the connection with a wiring board, etc., the male terminal 11 is projected outside from the lower surface of the insulating substrate 1. As depicted in FIG. 3, terminals 4 of the electric part 3 are placed on the upper ends (or noses 9) of the contacting portions 6. When the terminals 4 are pushed down together with the electric part 3, the contacting portions 6 are moved diagonally along the inclination axis by the pushing down force and accumulates elastic force directing upward.

Figure 5:
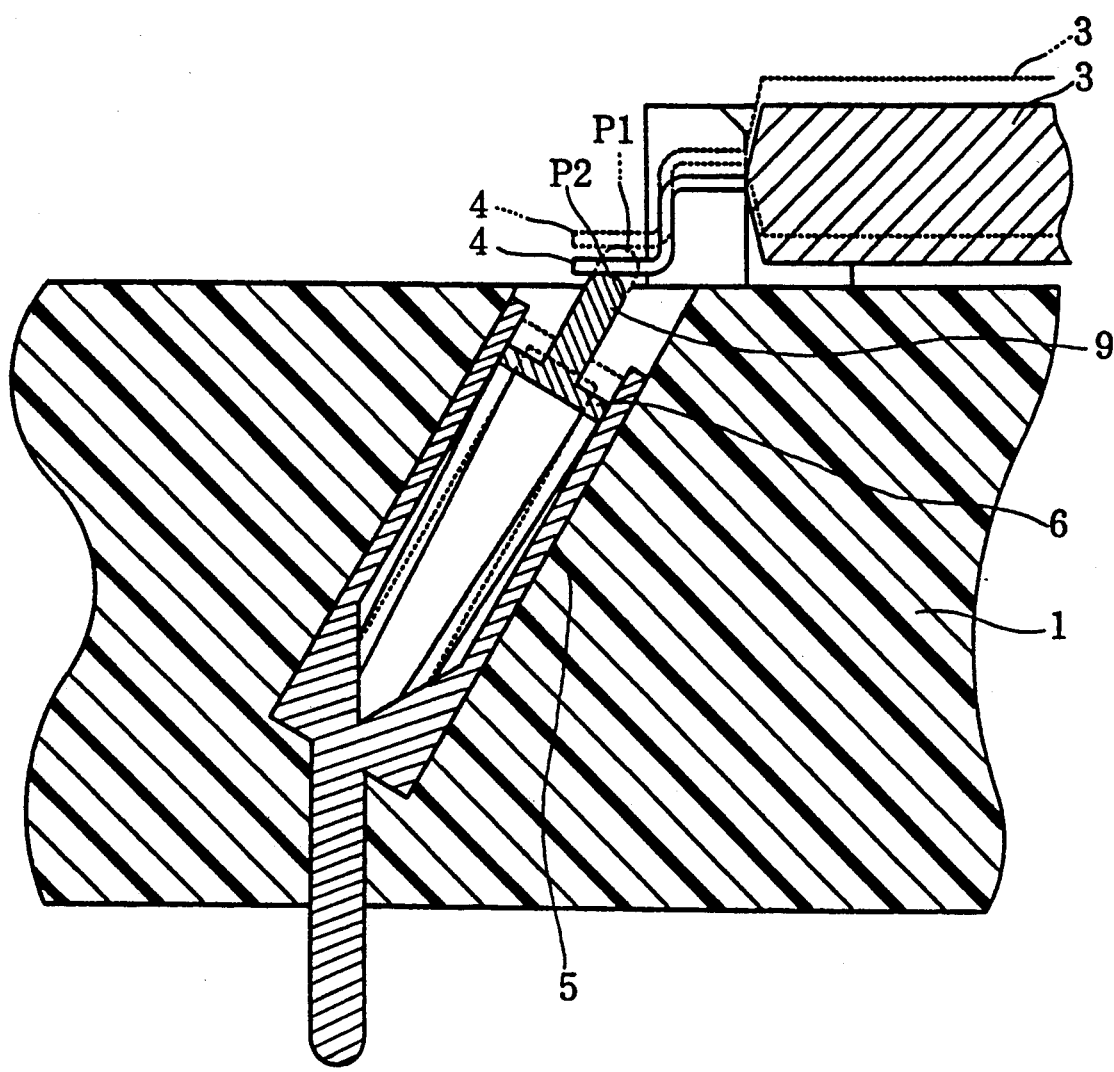
FIG. 5 is likewise an enlarged sectional view but showing a composite view of FIGS. 3 and 4.

More specifically, the contacting portion 6 is diagonally moved downward from a position indicated by imaginary lines shown in FIG. 5 to a position indicated by solid lines to accumulate the elastic force and press contacted with the lower end of the terminal 4. As the progress of the downward movement of the nose 9 of the contacting portion 6 while being press contacted with the lower surface of the terminal 4, the nose 9 is slid from a contacting point P1 indicated by imaginary lines shown in FIG. 5 to a contacting point P2 to effect a so-called "wiping" with respect to the contacting surface.

As means for pushing down the electric part and its terminals, as shown in FIGS. 1 and 2, a presser cover 12 is open- and- closably supported by one end of the insulating substrate 1, so that when the presser cover 12 is closed onto the substrate 1, it pushes down each electric part terminal 4, as shown in FIG. 4, in order to exert a pushing down force to the contacting portion 6. A lock member 13 is pivotably supported by the other end of the substrate 1, so that this lock member 13 engages with the end portion of the presser cover 12 thus closed, in order to maintain the pushed-down state by the cover 12 and to hold the electric part 3 on the connector.

The contactors 5 are inclined in the same direction as shown for example in FIG. 3. As a modified embodiment, however, the present invention includes the case where the contactors arranged on one side of opposing two sides of the mounting section 2 are declined in the opposite direction with respect to the inclination direction of the contactors arranged on the other side, in other words, the contactors are inclined in symmetric relation.

In any of the above embodiments, there can be selected either the left inclination as the left-hand side contactor of FIG. 3, or the right inclination as the right-hand side contactor of FIG. 3. The contactor may be inclined in the upward and downward direction (three dimensional inclination) with respect to paper surface depicted.

In the example of the electric part 3 shown in FIG. 3, the IC package main body is provided with a plurality of terminals projecting sideward therefrom. However, it may be designed such a plurality of conductive foils are intimately attached to a lower surface of the IC package body in order to form the terminal 4 which is to be placed on and contacted with the contactor.

As described in the foregoing, at the time when the contacting portion is moved diagonally along the inclination axis of movement, the contacting portion is press contacted with the electric part terminal and in the meantime, its contacting point is slid along the contacting surface of the terminal to realize a wiping action. By this, there can be obtained a wholesome contact while removing an oxide film. Moreover, the inclination of the contactor for orienting the axis of movement of the contacting portion at angles contributes to a thinner insulating substrate forming a connector body.

What is claimed is:

1. A connector for an electric part comprising an insulating substrate and contactors each including a movable contacting portion on which a terminal of an electric part is placed, and implanted in said insulating substrate, said movable contacting portion being moved downward along an axis of movement thereof to accumulate an ascending resilient force for obtaining a contacting pressure with respect to said electric part terminal, wherein said contactor is implanted in said insulating substrate at an inclination angle with respect to a mounting plane of said insulating substrate, said movable contacting portion being diagonally moved downward along the inclined axis of movement in order to obtain the contacting pressure.

2. A connector for an electric part as claimed in claim 1, wherein said movable contacting portion is axially moved within a cylindrical portion which is disposed in said insulating substrate in an inclined posture.

3. A connector for an electric part as claimed in claim 2, wherein said movable contacting portion has a spring element extending in the axial direction of movement in parallel relation therewith, said spring element being urged against an inner wall of said cylindrical portion in accordance with the downward movement of said contacting portion to accumulate said ascending resilient force.

* * * * *